(12) United States Patent
Bateman et al.

(10) Patent No.: US 7,727,866 B2
(45) Date of Patent: Jun. 1, 2010

(54) USE OF CHAINED IMPLANTS IN SOLAR CELLS

(75) Inventors: Nicholas Bateman, Burlington, MA (US); Atul Gupta, Beverly, MA (US); Paul Sullivan, Wenham, MA (US); Paul Murphy, Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/397,634

(22) Filed: Mar. 4, 2009

(65) Prior Publication Data

US 2009/0227094 A1    Sep. 10, 2009

Related U.S. Application Data

(60) Provisional application No. 61/033,873, filed on Mar. 5, 2008.

(51) Int. Cl.
*H01L 21/425* (2006.01)
(52) U.S. Cl. .................. 438/514; 438/57; 438/73; 438/455; 438/458; 257/617; 257/E21.568; 257/E21.346; 257/E31.032
(58) Field of Classification Search .................. 438/514, 438/57, 73, 455, 458; 257/617, E21, 568, 257/346, E31, 32
See application file for complete search history.

(56) References Cited

U.S. PATENT DOCUMENTS 4,086,102 A    4/1978  King
4,140,610 A    2/1979  Morimoto
5,563,095 A    10/1996 Frey
5,753,531 A    5/1998  Frey
6,153,524 A    11/2000 Henley et al.
6,184,111 B1   2/2001  Henley et al.
6,207,005 B1   3/2001  Henley et al.
6,321,134 B1   11/2001 Henley et al.
6,544,862 B1   4/2003  Bryan
7,498,245 B2*  3/2009  Aspar et al. ................. 438/514
2009/0068783 A1 3/2009 Borden

FOREIGN PATENT DOCUMENTS

EP    1094521 A2    4/2001
JP    62-219920 A   9/1987

* cited by examiner

*Primary Examiner*—Matthew Smith
*Assistant Examiner*—Wilner Jean Baptiste (57) ABSTRACT

The manufacture of solar cells is simplified and cost reduced through by performing successive ion implants, without an intervening thermal cycle. In addition to reducing process time, the use of chained ion implantations may also improve the performance of the solar cell. In another embodiment, two different species are successively implanted without breaking vacuum. In another embodiment, the substrate is implanted, then flipped such that it can be and implanted on both sides before being annealed. In yet another embodiment, one or more different masks are applied and successive implantations are performed without breaking the vacuum condition, thereby reducing the process time.

20 Claims, 8 Drawing Sheets

FIG. 8

USE OF CHAINED IMPLANTS IN SOLAR CELLS

This application claims priority of U.S. Provisional Patent Application Ser. No. 61/033,873, filed Mar. 5, 2008, the disclosure of which is hereby incorporated by reference.

FIELD

This invention relates to ion implantation, and, more particularly, to ion implantation of solar cells.

BACKGROUND

Ion implantation is a standard technique for introducing conductivity-altering impurities into semiconductor substrates. A desired impurity material is ionized in an ion source, the ions are accelerated to form an ion beam of prescribed energy, and the ion beam is directed at the surface of the substrate. The energetic ions in the beam penetrate into the bulk of the semiconductor material and are embedded into the crystalline lattice of the semiconductor material to form a region of desired conductivity.

Solar cells are typically manufactured using the same processes used for other semiconductor devices, often using silicon as the substrate material. A semiconductor solar cell is a simple device having an in-built electric field that separates the charge carriers generated through the absorption of photons in the semiconductor material. This electric field is typically created through the formation of a p-n junction (diode), which is created by differential doping of the semiconductor material. Doping a part of the semiconductor substrate (e.g. surface region) with impurities of opposite polarity forms a p-n junction that may be used as a photovoltaic device converting light into electricity.

Figure 3:
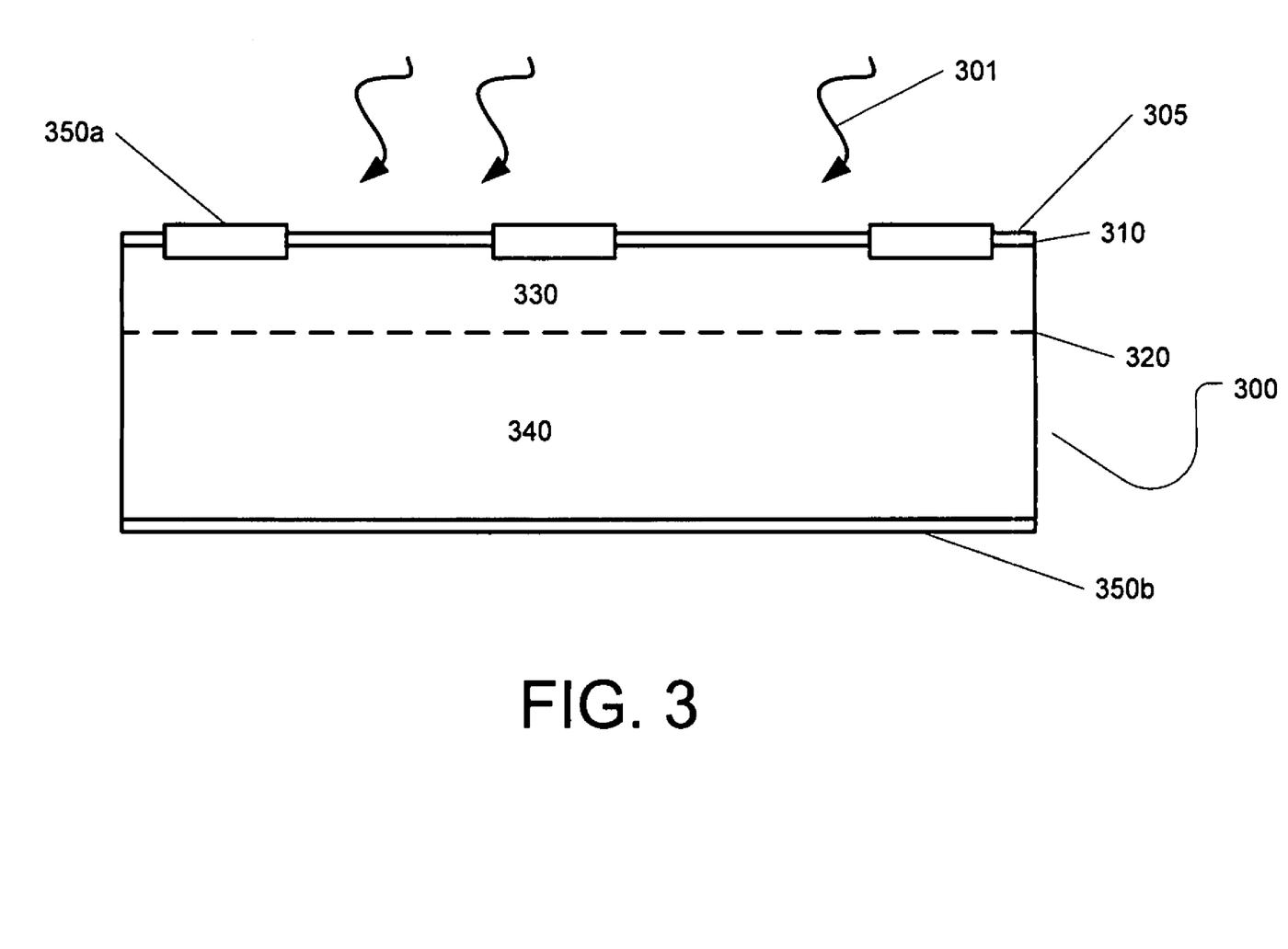
FIG. 3 shows a cross section of a solar cell of the prior art.

FIG. 3 shows a first embodiment of a solar cell, and is a cross section of a representative substrate 300. Photons 301 enter the solar cell 300 through the top surface 305, as signified by the arrows. These photons pass through an anti-reflective coating 310, designed to maximize the number of photons that penetrate the substrate 300 and minimize those that are reflected away from the substrate.

Internally, the substrate 300 is formed so as to have a p-n junction 320. This junction is shown as being substantially parallel to the top surface 305 of the substrate 300 although there are other implementations where the junction may not be parallel to the surface. The solar cell is fabricated such that the photons enter the substrate through a heavily doped region, also known as the emitter 330. In some embodiments, the emitter 330 may be an n-type doped region, while in other embodiments, the emitter may be a p-type doped region. The photons with sufficient energy (above the bandgap of the semiconductor) are able to promote an electron within the semiconductor material's valence band to the conduction band. Associated with this free electron is a corresponding positively charged hole in the valence band. In order to generate a photocurrent that can drive an external load, these electron hole (e-h) pairs need to be separated. This is done through the built-in electric field at the p-n junction. Thus any e-h pairs that are generated in the depletion region of the p-n junction get separated, as are any other minority carriers that diffuse to the depletion region of the device. Since a majority of the incident photons are absorbed in near surface regions of the device, the minority carriers generated in the emitter need to diffuse across the depth of the emitter to reach the depletion region and get swept across to the other side. Thus to maximize the collection of photo-generated current and minimize the chances of carrier recombination in the emitter, it is preferable to have the emitter region 330 be very shallow.

Some photons pass through the emitter region 330 and enter the base 340. In the scenario where the emitter 330 is an n-type region, the base 340 is a p-type doped region. These photons can then excite electrons within the base 340, which are free to move into the emitter region 330, while the associated holes remain in the base 340. Alternatively, in the case where the emitter 330 is a p-type doped region, the base is an n-type doped region. In this case, these photons can then excite electrons within the base 340, which remain in the base region 340, while the associated holes move into the emitter 330. As a result of the charge separation caused by the presence of this p-n junction, the extra carriers (electrons and holes) generated by the photons can then be used to drive an external load to complete the circuit.

Figure 4:
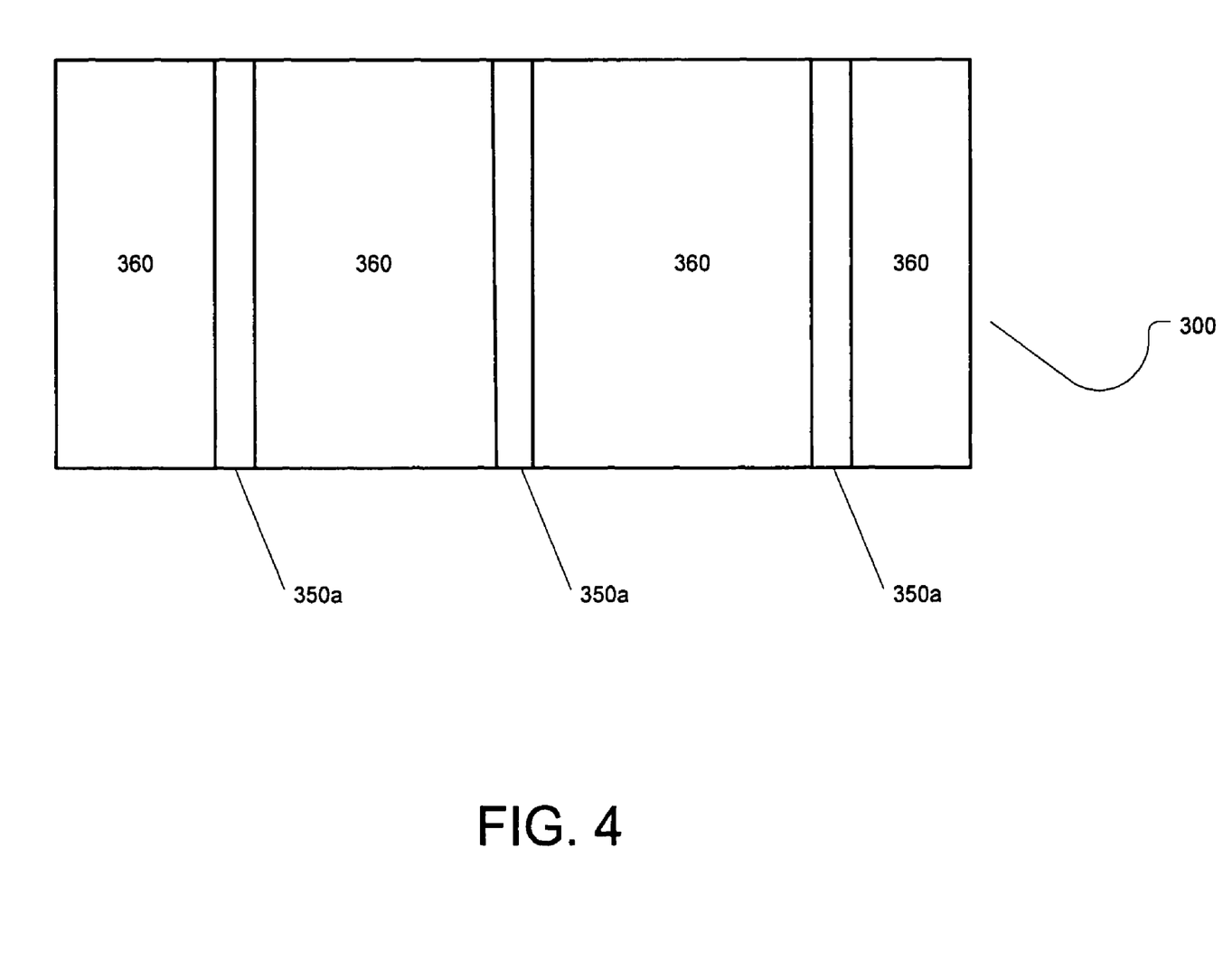
FIG. 4 shows a top view of the solar cell of FIG. 3.

By externally connecting the emitter region 330 to the base 340 through an external load, it is possible to conduct current and therefore provide power. To achieve this, contacts 350, typically metallic, are placed on the outer surface of the emitter region and the base. Since the base does not receive the photons directly, typically its contact 350b is placed along the entire outer surface. In contrast, the outer surface of the emitter region receives photons and therefore cannot be completely covered with contacts. However, if the electrons have to travel great distances to the contact, the series resistance of the cell increases, which lowers the power output. In an attempt to balance these two considerations (the distance that the free electrons must travel to the contact, and the amount of exposed emitter surface 360), most applications use contacts 350a that are in the form of fingers. FIG. 4 shows a top view of the solar cell of FIG. 3. The contacts are typically formed so as to be relatively thin, while extending the width of the solar cell. In this way, free electrons need not travel great distances, but much of the outer surface of the emitter is exposed to the photons. Typical contact fingers 350a on the front side of the substrate are 0.1 mm with an accuracy of +/−0.1 mm. These fingers 350a are typically spaced between 1-5 mm apart from one another. While these dimensions are typical, other dimensions are possible and contemplated herein.

Figure 5:
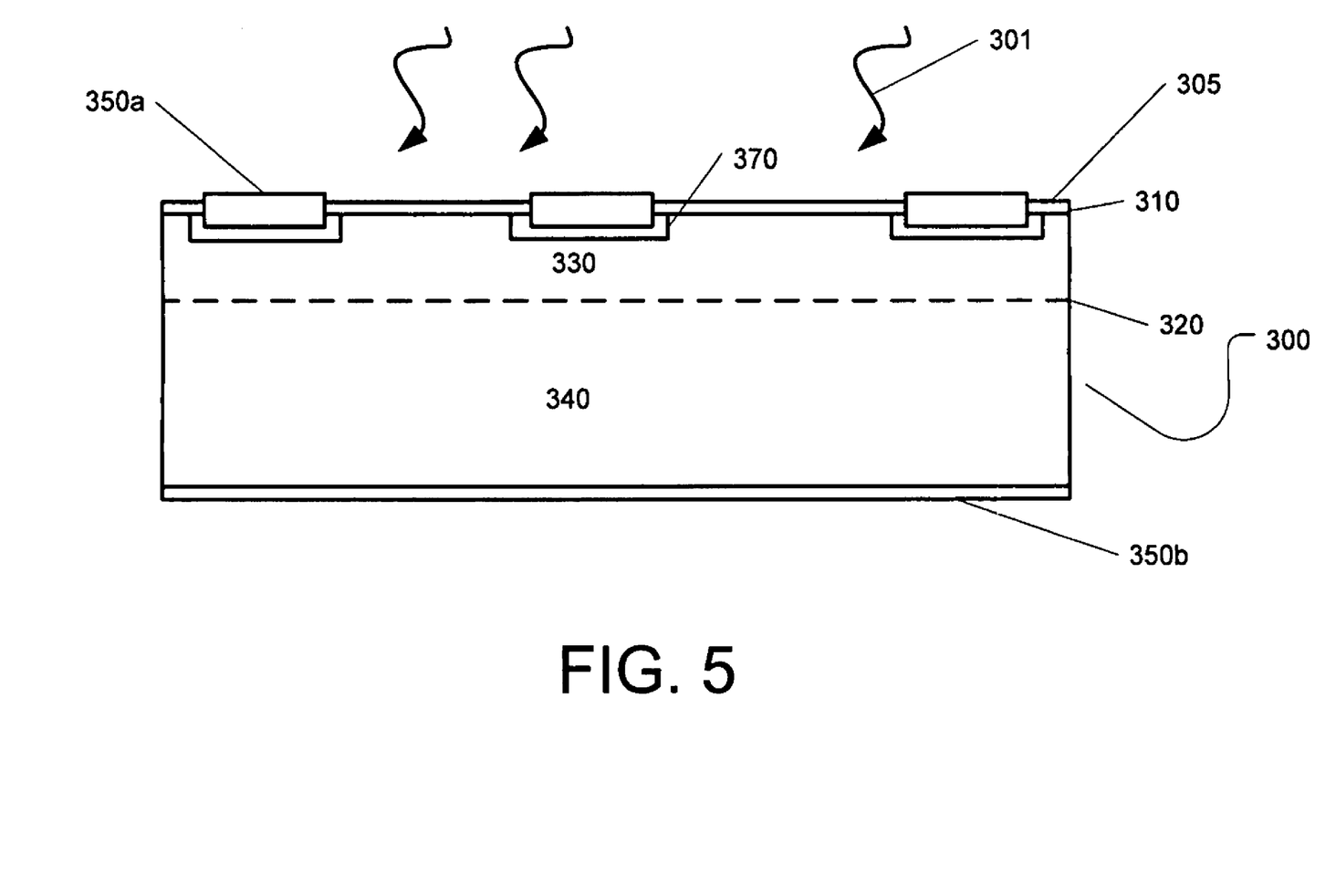
FIG. 5 shows a cross section of a solar cell using selective emitter design.

A further enhancement to solar cells is the addition of heavily doped substrate contact regions. FIG. 5 shows a cross section of this enhanced solar cell. The cell is as described above in connection with FIG. 3, but includes heavily doped contact regions 370. These heavily doped contact regions 370 correspond to the areas where the metallic fingers 350a will be affixed to the substrate 300. The introduction of these heavily doped contact regions 370 allows much better contact between the substrate 300 and the metallic fingers 350a and significantly lowers the series resistance of the cell. This pattern of including heavily doped regions on the surface of the substrate is commonly referred to as selective emitter design.

A selective emitter design for a solar cell also has the advantage of higher efficiency cells due to reduced minority carrier losses through recombination due to lower dopant/impurity dose in the exposed regions of the emitter layer. The higher doping under the contact regions provides a field that repels the minority carriers generated in the emitter and pushes them towards the p-n junction.

Figure 6:
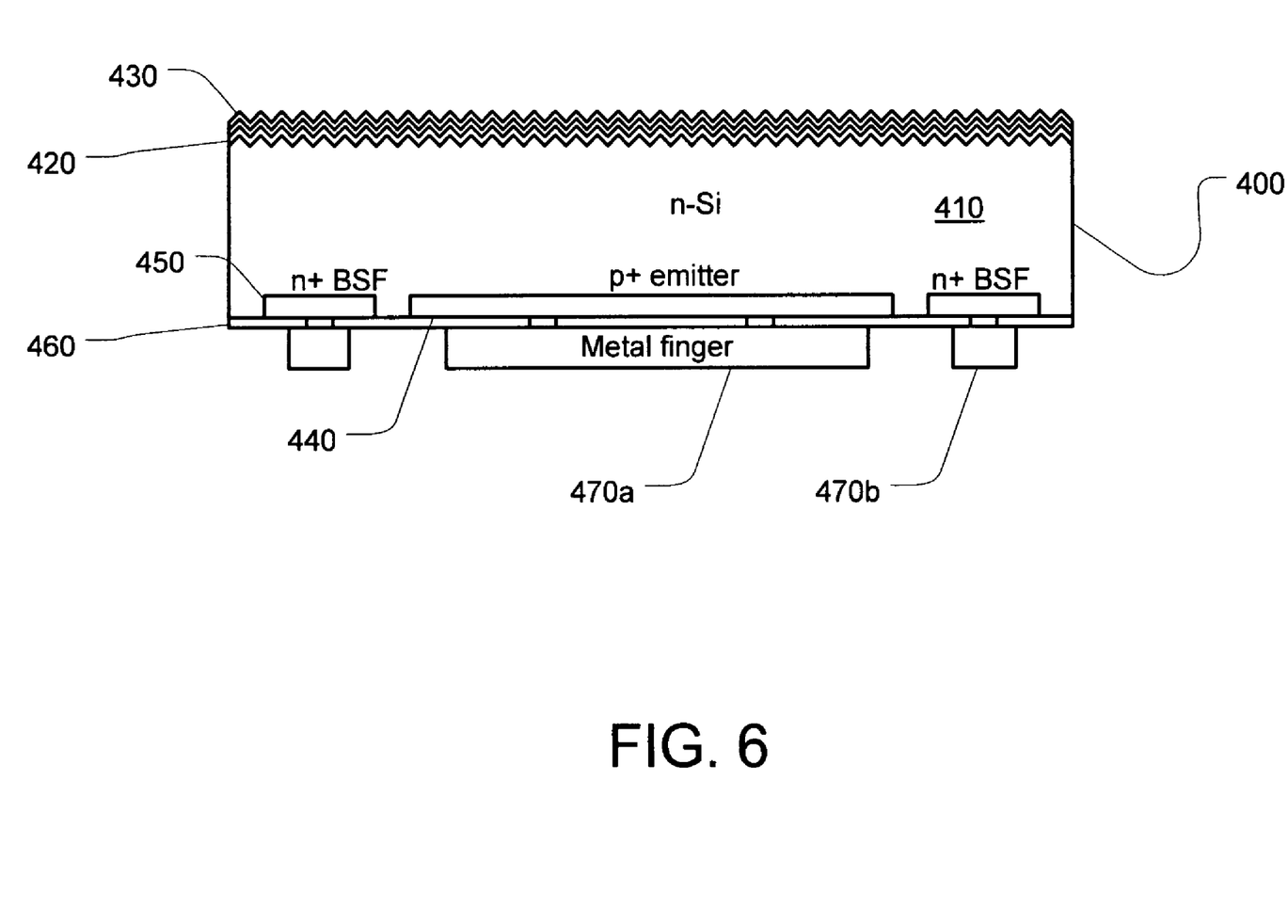
FIG. 6 shows a cross section of a second type of solar cell of the prior art.
Figure 7:
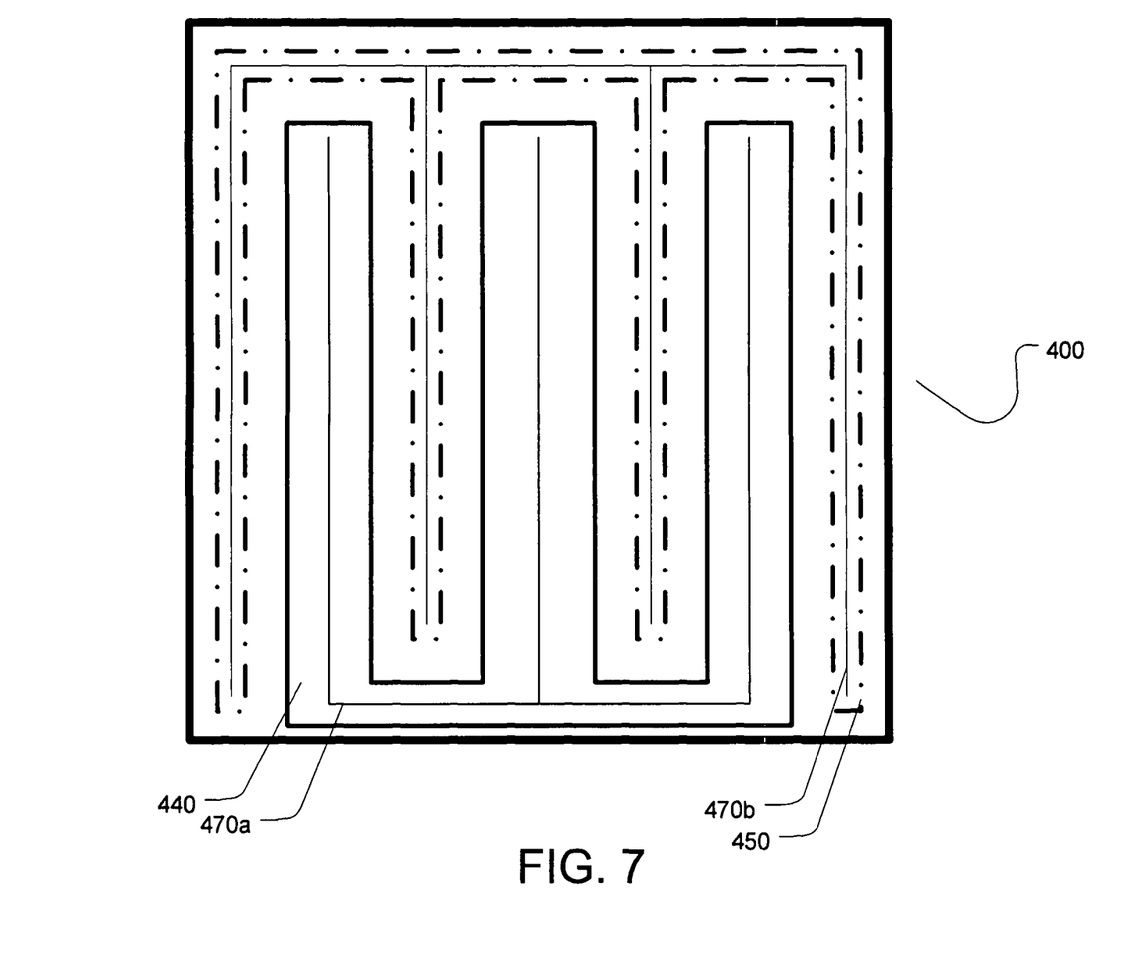
FIG. 7 shows a bottom view of the solar cell of FIG. 6.

The embodiment shown in FIG. 3 requires contacts on both sides of the substrate, thereby reducing the available area of the front surface through which photons may pass. A cross section of a second embodiment of a solar cell 400 is shown in FIG. 6. Fundamentally, the physics of this embodiment is similar, in which a p-n junction is used to create an electric field which separates the generated electron hole pairs. However, rather than create the p-n junction across the entire substrate, as done in the previous embodiment, the junctions are only created in portions of the substrate 400. In this embodiment, a negatively doped silicon substrate 410 may be used. In certain embodiments, a more negatively biased front surface field (FSF) 420 is created by implanting addition n-type dopants in the front surface. This front surface is then coated with an anti-reflective material 430. This front surface is often etched to create a sawtooth or other non-planar surface, so as to increase surface area. The metallic contacts or fingers 470 are all located on the bottom surface of the substrate. Certain portions of the bottom surface may be implanted with p-type dopants to create emitters 440. Other portions are implanted with n-type dopants to create more negatively biased back surface field 450. The back surface is coated with a dielectric layer 460 to enhance the reflectivity of the back surface. Metal fingers 470a are attached to the emitter 440 and fingers 470b attaches to the BSF 450. FIG. 7 shows one commonly used configuration of the metal fingers on the back surface. This type of cell is known as an interdigitated back contact (IBC) solar cell.

With current energy costs and environmental concerns, solar cells are becoming increasingly important. Any reduced cost to the manufacturing or production of high-performance solar cells or any efficiency improvement to high-performance solar cells would have a positive impact on the implementation of solar cells worldwide. This will enable the wider availability of this clean energy technology.

Current solar cell design is limited by the dopant profiles that can be achieved by diffusing dopants into the silicon of the solar cell. It is also limited by the difficulty in applying different dopants and doping different parts of a solar cell. The cost of additional doping steps limits the solar cell designs that may be used commercially. Accordingly, there is a need in the art for improved ion implantation of solar cells and, more particularly, a method that allows successive doping steps of a solar cell with an ion implanter.

SUMMARY

The manufacture of solar cells is simplified and cost reduced through the use of the methods disclosed herein. By performing successive implants, without breaking vacuum, solar cells can be produced more rapidly. In addition, the use of chained implanted may also improve the performance of the cell. In one embodiment, two implants are performed, wherein the same ion species is used, but the implant energy is modified between implants. In another embodiment, the substrate is flipped and implanted on both sides before being annealed. In yet another embodiment, one or more different masks are applied and implantations are performed without breaking the vacuum condition.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1:
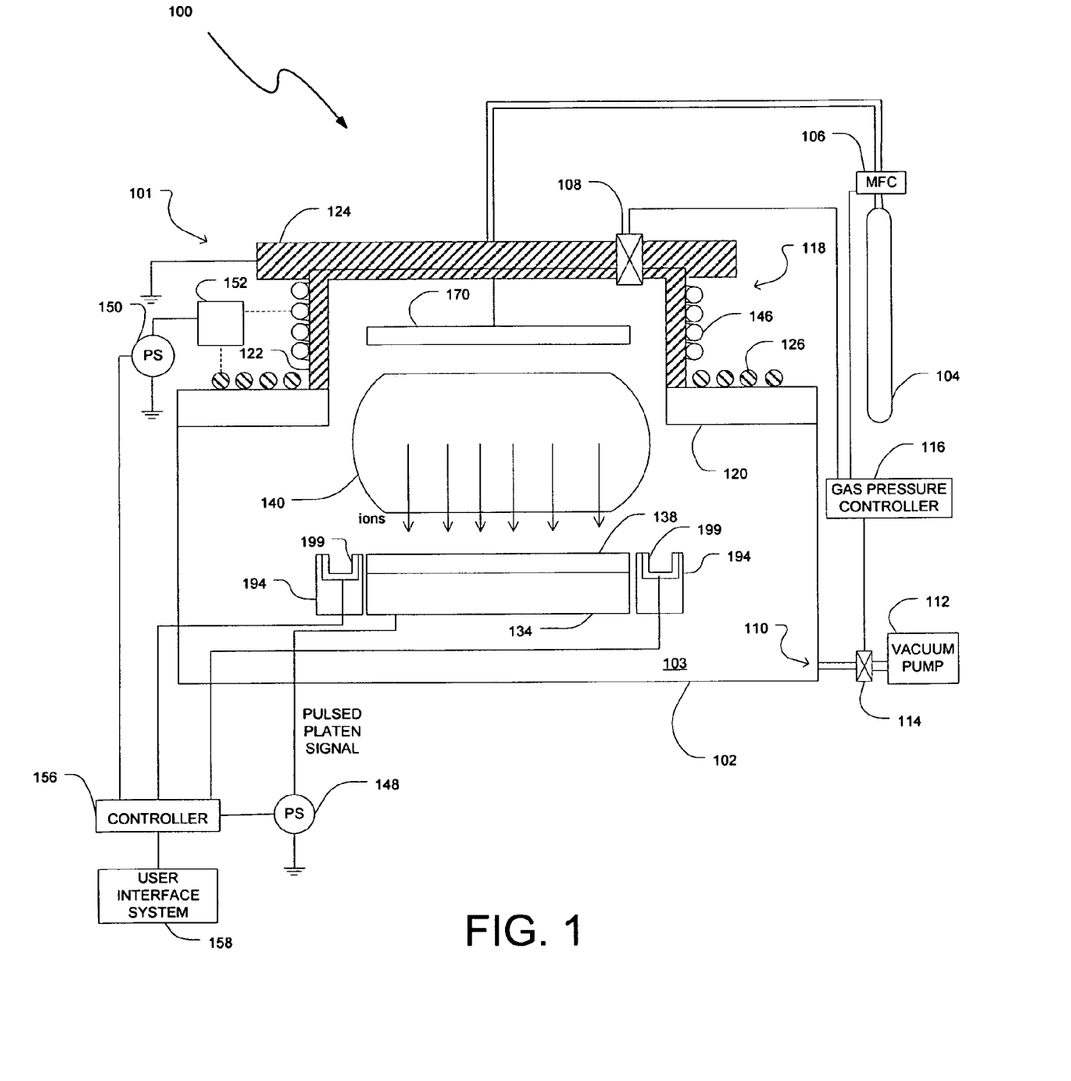
FIG. 1 is a block diagram of a plasma doping system for doping a material with ions.
Figure 2:
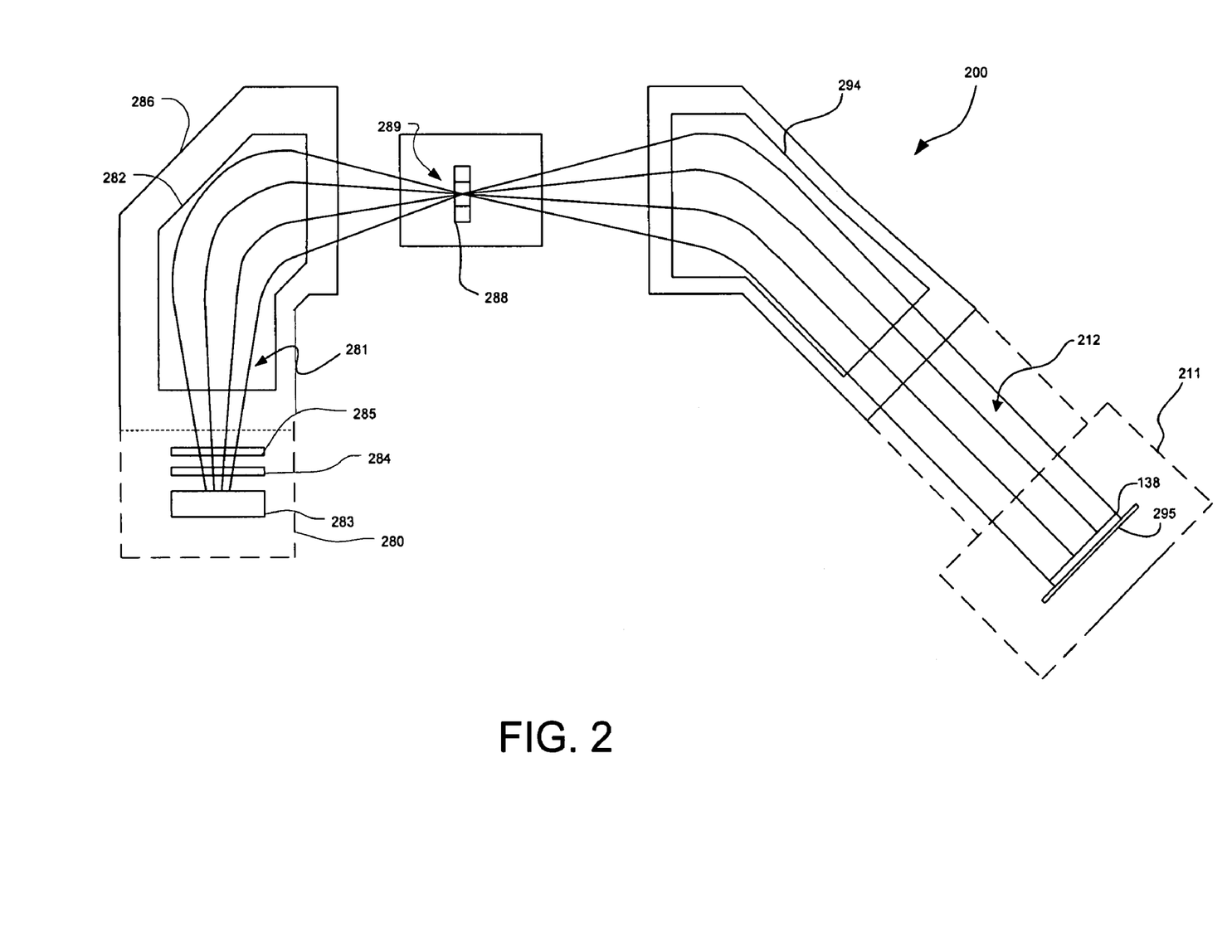
FIG. 2 is a block diagram of a beam-line ion implanter for doping a material with ions.

FIG. 1 is a block diagram of a plasma doping system 100 that may provide ions for doping a selected material. FIG. 2 is a block diagram of a beam-line ion implanter 200 that may provide ions for doping a selected material. Those skilled in the art will recognize that the plasma doping system 100 and the beam-line ion implanter 200 are each only one of many examples of differing plasma doping systems and beam-line ion implanters that can provide ions for doping a selected material. This process may also be performed with other ion implantation systems, such as a non-mass analyzed flood implanter, other substrate or semiconductor wafer processing equipment, or some combination of two or more of these systems.

Turning to FIG. 1, the plasma doping system 100 includes a process chamber 102 defining an enclosed volume 103. A platen 134 may be positioned in the process chamber 102 to support a substrate 138. In one instance, the substrate 138 may be a semiconductor substrate having a disk shape, such as, in one embodiment, a 300 millimeter (mm) diameter silicon wafer. This substrate 138 may be a solar cell. The substrate 138 may be clamped to a flat surface of the platen 134 by electrostatic or mechanical forces. In one embodiment, the platen 134 may include conductive pins (not shown) for making connection to the substrate 138.

A gas source 104 provides a dopant gas to the interior volume 103 of the process chamber 102 through the mass flow controller 106. A gas baffle 170 is positioned in the process chamber 102 to deflect the flow of gas from the gas source 104. A pressure gauge 108 measures the pressure inside the process chamber 102. A vacuum pump 112 evacuates exhausts from the process chamber 102 through an exhaust port 110 in the process chamber 102. An exhaust valve 114 controls the exhaust conductance through the exhaust port 110.

The plasma doping system 100 may further include a gas pressure controller 116 that is electrically connected to the mass flow controller 106, the pressure gauge 108, and the exhaust valve 114. The gas pressure controller 116 may be configured to maintain a desired pressure in the process chamber 102 by controlling either the exhaust conductance with the exhaust valve 114 or a process gas flow rate with the mass flow controller 106 in a feedback loop that is responsive to the pressure gauge 108.

The process chamber 102 may have a chamber top 118 that includes a first section 120 formed of a dielectric material that extends in a generally horizontal direction. The chamber top 118 also includes a second section 122 formed of a dielectric material that extends a height from the first section 120 in a generally vertical direction. The chamber top 118 further includes a lid 124 formed of an electrically and thermally conductive material that extends across the second section 122 in a horizontal direction.

The plasma doping system may further include a source 101 configured to generate a plasma 140 within the process chamber 102. The source 101 may include a RF source 150, such as a power supply, to supply RF power to either one or both of the planar antenna 126 and the helical antenna 146 to generate the plasma 140. The RF source 150 may be coupled to the antennas 126, 146 by an impedance matching network 152 that matches the output impedance of the RF source 150 to the impedance of the RF antennas 126, 146 in order to maximize the power transferred from the RF source 150 to the RF antennas 126, 146.

The plasma doping system 100 may also include a bias power supply 148 electrically coupled to the platen 134. The bias power supply 148 is configured to provide a pulsed platen signal having pulse ON and OFF time periods to bias the platen 134, and, hence, the substrate 138, and to accelerate ions from the plasma 140 toward the substrate 138 during the pulse ON time periods and not during the pulse OFF periods. The bias power supply 148 may be a DC or an RF power supply.

The plasma doping system 100 may further include a shield ring 194 disposed around the platen 134. As is known in the art, the shield ring 194 may be biased to improve the uniformity of implanted ion distribution near the edge of the substrate 138. One or more Faraday sensors such as an annular Faraday sensor 199 may be positioned in the shield ring 194 to sense ion beam current.

The plasma doping system 100 may further include a controller 156 and a user interface system 158. The controller 156 can be or include a general-purpose computer or network of general-purpose computers that may be programmed to perform desired input/output functions. The controller 156 can also include other electronic circuitry or components, such as application-specific integrated circuits, other hardwired or programmable electronic devices, discrete element circuits, etc. The controller 156 may also include communication devices, data storage devices, and software. For clarity of illustration, the controller 156 is illustrated as providing only an output signal to the power supplies 148, 150, and receiving input signals from the Faraday sensor 199. Those skilled in the art will recognize that the controller 156 may provide output signals to other components of the plasma doping system and receive input signals from the same. The user interface system 158 may include devices such as touch screens, keyboards, user pointing devices, displays, printers, etc. to allow a user to input commands and/or data and/or to monitor the plasma doping system via the controller 156.

In operation, the gas source 104 supplies a primary dopant gas containing a desired dopant for implantation into the substrate 138. The gas pressure controller 116 regulates the rate at which the primary dopant gas is supplied to the process chamber 102. The source 101 is configured to generate the plasma 140 within the process chamber 102. The source 101 may be controlled by the controller 156. To generate the plasma 140, the RF source 150 resonates RF currents in at least one of the RF antennas 126, 146 to produce an oscillating magnetic field. The oscillating magnetic field induces RF currents into the process chamber 102. The RF currents in the process chamber 102 excite and ionize the primary dopant gas to generate the plasma 140.

The bias power supply 148 provides a pulsed platen signal to bias the platen 134 and, hence, the substrate 138 to accelerate ions from the plasma 140 toward the substrate 138 during the pulse ON periods of the pulsed platen signal. The frequency of the pulsed platen signal and/or the duty cycle of the pulses may be selected to provide a desired dose rate. The amplitude of the pulsed platen signal may be selected to provide a desired energy. With all other parameters being equal, a greater energy will result in a greater implanted depth.

Turning to FIG. 2, a block diagram of a beam-line ion implanter 200 that may provide ions for doping a selected material is illustrated. Those skilled in the art will recognize that the beam-line ion implanter 200 is only one of many examples of beam-line ion implanters that can provide ions for doping a selected material.

In general, the beam-line ion implanter 200 includes an ion source 280 to generate ions that form an ion beam 281. The ion source 280 may include an ion chamber 283 and a gas box containing a gas to be ionized. The gas is supplied to the ion chamber 283 where it is ionized. The ions thus formed are extracted from the ion chamber 283 to form the ion beam 281. The ion beam 281 is directed between the poles of resolving magnet 282. A power supply is connected to an extraction electrode of the ion source 280 and provides an adjustable voltage, for example, between about 0.2 and 80 kV in a high current ion implanter. Thus, singly charged ions from the ion source are accelerated to energies of about 0.2 to 80 keV by this adjustable voltage.

The ion beam 281 passes through a suppression electrode 284 and ground electrode 285 to mass analyzer 286. Mass analyzer 286 includes resolving magnet 282 and masking electrode 288 having resolving aperture 289. Resolving magnet 282 deflects ions in the ion beam 281 such that ions of a desired ion species pass through the resolving aperture 289. Undesired ion species do not pass through the resolving aperture 289, but are blocked by the masking electrode 288. In one embodiment, resolving magnet 282 deflects ions of the desired species by about 90°.

Ions of the desired ion species pass through the resolving aperture 289 to the angle corrector magnet 294. Angle corrector magnet 294 deflects ions of the desired ion species and converts the ion beam from a diverging ion beam to ribbon ion beam 212, which has substantially parallel ion trajectories. In one embodiment, the angle corrector magnet 294 deflects ions of the desired ion species by about 70°. The beam-line ion implanter 200 may further include acceleration or deceleration units in some embodiments.

An end station 211 supports one or more workpieces, such as substrate 138, in the path of ribbon ion beam 212 such that ions of the desired species are implanted into substrate 138. The substrate 138 may be, for example, a silicon wafer. This substrate 138 may be a solar cell. The end station 211 may include a platen 295 to support the substrate 138. The end station 211 also may include a scanner (not shown) for moving the substrate 138 perpendicular to the long dimension of the ribbon ion beam 212 cross-section, thereby distributing ions over the entire surface of substrate 138. Although the ribbon ion beam 212 is illustrated, other embodiments may provide a spot beam.

The ion implanter may include additional components known to those skilled in the art. For example, the end station 211 typically includes automated workpiece handling equipment for introducing workpieces into the beam-line ion implanter 200 and for removing workpieces after ion implantation. The end station 211 also may include a dose measuring system, an electron flood gun, or other known components. It will be understood to those skilled in the art that the entire path traversed by the ion beam is evacuated during ion implantation. The beam-line ion implanter 200 may incorporate hot or cold implantation of ions in some embodiments.

Productivity and solar cell efficiency may be increased by performing two or more implants. These are performed in the same implant tool without breaking vacuum as a "chained implant," or one implant immediately after the other. In addition to reducing costs and improving productivity and solar cell efficiency, this method may further improve the dopant profiles. There are many different ways that chained implants may be incorporated into the solar cell production process. These processes may be performed in either the plasma doping system 100 of FIG. 1, the beam-line ion implanter 200 of FIG. 2, other ion implantation systems, such as a non-mass analyzed flood implanter, other substrate or semiconductor wafer processing equipment, or some combination of two or more of these systems.

First, two or more implants at different energies can be performed in a chained implant. The range of energies will allow a detailed tailoring of the dopant profile. For example, for doping of the emitter 330 in a front contact cell, such as is shown in FIG. 3, a deep lower dose implant could be performed to prevent the contacts 350 from shorting the junction. A shallow higher dose implant could also be performed to create a high dopant concentration at the surface of the cell. This combination of implants creates a dopant profile that decreases moving away from the front surface toward the back surface. Such a profile may also minimize recombination by creating a directed electric field that accelerates minority carriers toward the p-n junction. In one particular embodiment, beam energy of the beam-line ion implanter 200 of FIG. 2 may be changed by adding a deceleration voltage before the beam reaches the solar cell on the platen.

Second, implants of different species may be performed in a chained implant without moving the substrate. In one embodiment, arsenic is used as an n-type dopant in addition to phosphorus. A later thermal process would then take advantage of the differing behaviors of these two n-type dopants. For example, one dopant may diffuse deeper into the substrate, while the other remains closer to the surface, thereby creating a dopant gradient. This dopant gradient helps to minimize surface recombination. In other embodiments, boron, arsenic, phosphorus, gallium, aluminum, or other species known to those skilled in the art may be used. In other embodiments, species that do not affect the doping concentration, also known as non-dopants, such as those elements belonging in Group IV, such as carbon, silicon and germanium, may be used. While it is difficult to change species in a diffusion furnace, in an ion implanter, such as the plasma doping system 100 of FIG. 1 or the beam-line ion implanter 200 of FIG. 2, changing the species may be performed by changing ion sources, beam lines, or the gas or solid material used to provide the dopant atoms. While this may increase complexity and cost of the plasma doping system 100 of FIG. 1 or the beam-line ion implanter 200 of FIG. 2, this increase is significantly less than purchasing a second implanter.

Third, the side of the substrate being implanted can be changed during a chained implant. By flipping a substrate over during implantation, a second implant can be performed immediately on the reverse side without breaking vacuum. This flipping may be accomplished, for example, through robotic substrate handling devices. In one embodiment, flipping the substrate over is combined with changing the species being implanted. For example, ions are implanted on both surfaces of an IBC cell, shown in FIG. 6. An n+ implantation 420 is performed on the front surface, while both n+ implants 450 and p+ implants 440 are performed on the back surface. Thus, the implantation on the front surface can be performed and then the substrate can be flipped so that a boron back surface field of a solar cell may be performed. In another particular embodiment, the implantation of a front surface field and one set of contacts on an IBC solar cell are performed. In another embodiment, the n+ front surface field and n+ back surface field, as shown in FIG. 6, are applied. With current diffusion technology, it is not possible to apply different doses to different sides of a cell. Implanting both sides of the substrate without breaking vacuum may reduce the number of required process steps to manufacture a solar cell.

Figure 8:
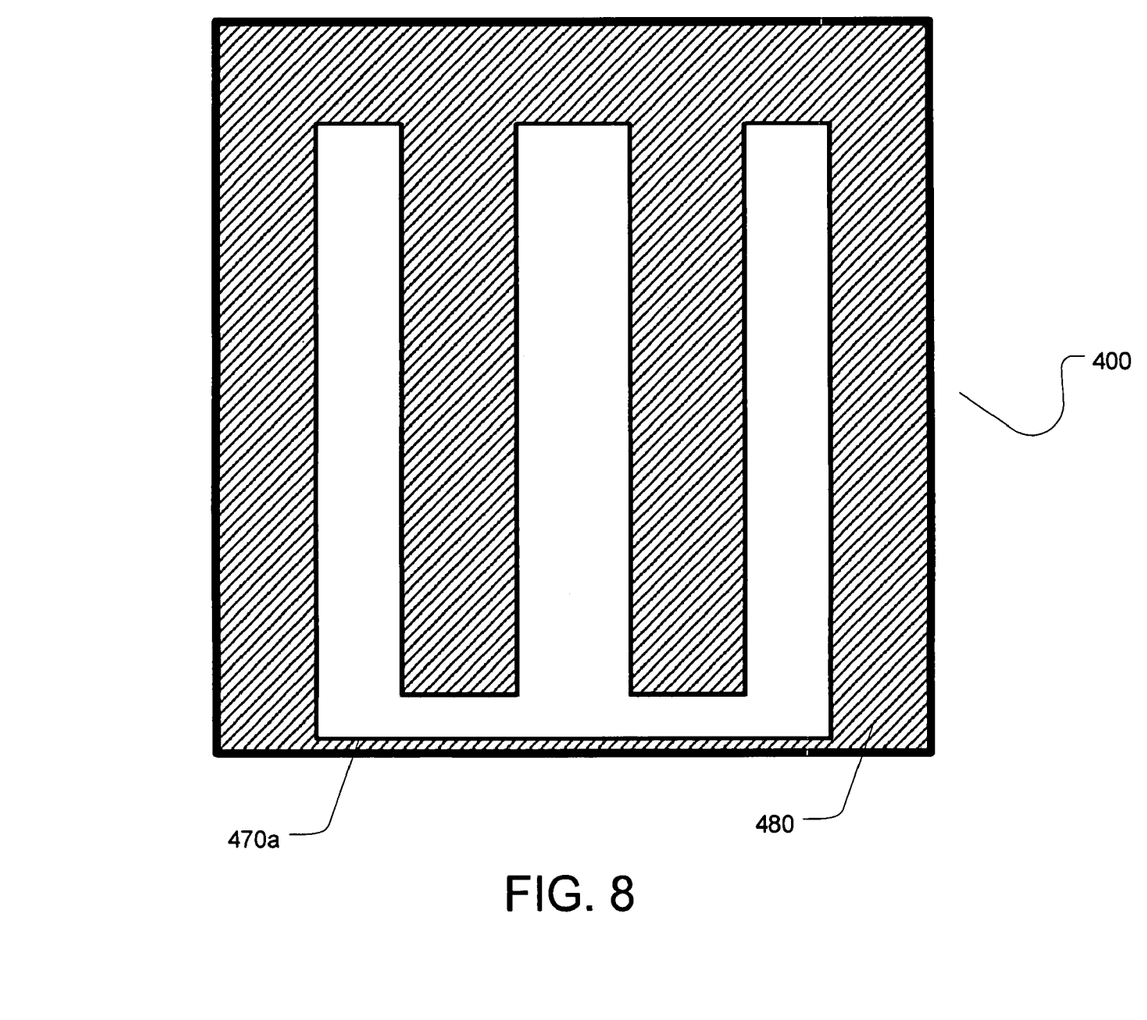
FIG. 8 shows a mask for use with the solar cell of FIG. 7.

Fourth, the pattern of the implant can be changed during a chained implant. By inserting a mask or applying some mask to the substrate, multiple implants with different distributions on the surface of the solar cell may be performed. This mask may be a hard mask, shadow mask or stencil mask that blocks portions of the substrate from being implanted in some embodiments. In one particular embodiment, the front surface of the solar cell of FIG. 5 is doped. A mask is then placed on the substrate 300, such that only the contact regions 370 are exposed. A second implant of higher dose is then performed to improve conductivity of these regions. In another embodiment, the n+ back surface field 450 of an IBC solar cell, such as that shown in FIGS. 6 and 7, is implanted with an n-type dopant, while a mask is used to cover a portion of the surface. Then, a second mask is used which leaves only the p+ emitter exposed. Such a mask is shown in FIG. 8. Following the placement of the mask, a p-type dopant is implanted. This sequence of implants with different masks allows the creation of the contact pattern required for IBC cells. Thus, when combined with a change of species, all of the back contact doping for an IBC solar cell may be performed at once. In any embodiment, the contacts may be doped on either the front or back of the solar cell with this method. The buried contact approach allows a similar doping scheme at higher cost. In another embodiment, an n++ implant is performed with a mask and an n+ implant is then performed without a mask.

Fifth, an immediate thermal anneal after chained implants may be performed in the same chamber that the implants were performed in. This will allow reduction in processing time and cost. This anneal performed in an implant chamber may be, for example, a flash anneal, laser anneal, spike anneal, or other annealing method known to those skilled in the art.

Sixth, these chained implants may be performed in a cluster tool. The cluster tool may incorporate multiple plasma doping systems 100 as seen in FIG. 1 in one particular embodiment. Thus, the chain implants may be performed without breaking vacuum in multiple plasma doping chambers or may be performed with multiple implants in a single plasma doping chamber.

The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A method of manufacturing a solar cell using a substrate, comprising:
    creating a vacuum wherein said substrate is implanted;
    performing a first ion implantation on first surface of said substrate using a first species;
    introducing a mask pattern so as to cover a portion of said first surface of said substrate; and
    performing a second ion implantation on said surface using a second species, whereby only an uncovered portion of said first surface of said substrate is implanted with said second species, and wherein said first and second ion implantations are performed without breaking said vacuum.

2. The method of claim 1, wherein said first and second species are the same species.

3. The method of claim 1, wherein said first and second species comprise dopants.

4. The method of claim 1, wherein said first and second species are different species.

5. The method of claim 1, wherein said first species or said second species comprises a non-dopant.

6. The method of claim 1, wherein a second mask pattern is introduced prior to said first ion implantation, such that only a portion of said substrate is implanted by said first species.

7. A method of manufacturing a solar cell using a substrate, comprising:
   creating a vacuum wherein said substrate is implanted;
   performing a first ion implantation on a first surface of said substrate using a first species;
   flipping said substrate so as to expose a second surface;
   introducing a mask pattern so as to cover a portion of said second surface of said substrate; and
   performing a second ion implantation on said second surface using a second species, whereby only an uncovered portion of said second surface of said substrate is implanted with said second species, and wherein said first and second ion implantations are performed without breaking said vacuum.

8. The method of claim 7, wherein said first and second species are the same species.

9. The method of claim 7, wherein said first and second species comprise dopants.

10. The method of claim 7, wherein said first and second species are different species.

11. The method of claim 7, wherein said first species or said second species comprises a non-dopant.

12. The method of claim 7, wherein a second mask pattern is introduced prior to said first ion implantation, such that only a portion of said first surface of said substrate is implanted by said first species.

13. A method of manufacturing a solar cell using a substrate, comprising:
   creating a vacuum wherein said substrate is implanted;
   performing a first ion implantation on a first surface of said substrate using a first species;
   flipping said substrate so as to expose a second surface; and
   performing a second ion implantation on said second surface using a second species, wherein said first and second ion implantations are performed without breaking said vacuum.

14. The method of claim 13, wherein said first and second species are the same species.

15. The method of claim 13, wherein said first and second species comprise dopants.

16. The method of claim 13, wherein said first and second species are different species.

17. The method of claim 13, wherein said first species or said second species comprises a non-dopant.

18. The method of claim 13, wherein a first mask pattern is introduced prior to said first ion implantation, such that only a portion of said first surface of said substrate is implanted by said first species.

19. The method of claim 17, wherein a second mask pattern is introduced prior to said second ion implantation, such that only a portion of said second surface of said substrate is implanted by said second species.

20. The method of claim 13, wherein a mask pattern is introduced prior to said second ion implantation, such that only a portion of said second surface of said substrate is implanted by said second species.

* * * * *

UNITED STATES PATENT AND TRADEMARK OFFICE
CERTIFICATE OF CORRECTION

PATENT NO. : 7,727,866 B2  Page 1 of 1
APPLICATION NO. : 12/397634
DATED : June 1, 2010
INVENTOR(S) : Nicholas Bateman et al.

It is certified that error appears in the above-identified patent and that said Letters Patent is hereby corrected as shown below:

In claim 1, on col. 8, line 51, add "a" before "first surface."
In claim 1, on col. 8, line 56, add "first" before "surface using."

Signed and Sealed this

Seventh Day of September, 2010

David J. Kappos
*Director of the United States Patent and Trademark Office*

(12) EX PARTE REEXAMINATION CERTIFICATE (9713th)
United States Patent
Bateman et al.

(10) Number: US 7,727,866 C1
(45) Certificate Issued: Jun. 25, 2013

(54) USE OF CHAINED IMPLANTS IN SOLAR CELLS

(75) Inventors: Nicholas Bateman, Burlington, MA (US); Atul Gupta, Beverly, MA (US); Paul Sullivan, Wenham, MA (US); Paul Murphy, Reading, MA (US)

(73) Assignee: Varian Semiconductor Equipment Associates, Inc., Gloucester, MA (US)

Reexamination Request:
No. 90/012,002, Dec. 9, 2011

Reexamination Certificate for:
Patent No.: 7,727,866
Issued: Jun. 1, 2010
Appl. No.: 12/397,634
Filed: Mar. 4, 2009

Certificate of Correction issued Sep. 7, 2010

Related U.S. Application Data

(60) Provisional application No. 61/033,873, filed on Mar. 5, 2008.

(51) Int. Cl.
*H01L 21/425* (2006.01)

(52) U.S. Cl.
USPC ............... 438/514; 438/57; 438/73; 438/455; 438/458; 257/617; 257/E21.568; 257/E21.346; 257/E31.032

(58) Field of Classification Search
None
See application file for complete search history.

(56) References Cited

To view the complete listing of prior art documents cited during the proceeding for Reexamination Control Number 90/012,002, please refer to the USPTO's public Patent Application Information Retrieval (PAIR) system under the Display References tab.

*Primary Examiner* — Yuzhen Ge (57) ABSTRACT

The manufacture of solar cells is simplified and cost reduced through by performing successive ion implants, without an intervening thermal cycle. In addition to reducing process time, the use of chained ion implantations may also improve the performance of the solar cell. In another embodiment, two different species are successively implanted without breaking vacuum. In another embodiment, the substrate is implanted, then flipped such that it can be and implanted on both sides before being annealed. In yet another embodiment, one or more different masks are applied and successive implantations are performed without breaking the vacuum condition, thereby reducing the process time.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 6, 12, 18 and 19 are cancelled.

Claims 1, 7, 13 and 20 are determined to be patentable as amended.

Claims 2-5, 8-11 and 14-17, dependent on an amended claim, are determined to be patentable.

1. A method of manufacturing a solar cell using a substrate, comprising:
   creating a vacuum wherein said substrate is *to be* implanted *for manufacturing said solar cell*;
   performing, *in said vacuum,* a first ion implantation on *an entirety of* a first surface of said substrate using a first species;
   introducing, *in said vacuum,* a mask [pattern] *having a first surface facing and spaced apart from said first surface of said substrate, said mask having a plurality of openings* so as to [cover a portion] *expose corresponding portions* of said first surface of said substrate; and
   performing, *in said vacuum,* a second ion implantation on said first surface using a second species, [whereby] *wherein* only [an uncovered portion] *said exposed portions* of said first surface of said substrate [is] *are* implanted with said second species, and wherein said first and second ion implantations *and said mask introduction* are performed without breaking said vacuum.

7. A method of manufacturing a solar cell using a substrate, comprising:
   creating a vacuum wherein said substrate is *to be* implanted *for manufacturing said solar cell*;
   performing, *in said vacuum,* a first ion implantation on *an entirety of* a first surface of said substrate using a first species;
   flipping, *in said vacuum,* said substrate so as to expose a second surface *of said substrate*;
   introducing, *in said vacuum,* a mask [pattern] *having a first surface facing and spaced apart from said second surface of said substrate, said mask having a plurality of openings* so as to [cover a portion] *expose corresponding portions* of said second surface of said substrate; and
   performing, *in said vacuum,* a second ion implantation on said second surface using a second species, [whereby] *wherein* only [an uncovered portion] *said exposed portions* of said second surface of said substrate [is] *are* implanted with said second species, and wherein said first and second ion implantations, *said substrate flipping, and said mask introduction* are performed without breaking said vacuum.

13. A method of manufacturing a solar cell using a substrate, comprising:
    creating a vacuum wherein said substrate is *to be* implanted *for manufacturing said solar cell*;
    performing, *in said vacuum,* a first ion implantation on *an entirety of* a first surface of said substrate using a first species;
    flipping, *in said vacuum,* said substrate so as to expose a second surface *of said substrate*; and
    performing, *in said vacuum,* a second ion implantation on said second surface using a second species, wherein said first and second ion implantations *and said substrate flipping* are performed without breaking said vacuum.

20. The method of claim 13, wherein a mask [pattern] is introduced *in said vacuum without breaking said vacuum* prior to said second ion implantation, *wherein said mask has a first surface facing and spaced apart from said second surface of said substrate, and wherein said mask has a plurality of openings so as to expose corresponding portions of said second surface of said substrate* such that only [a portion] *said exposed portions* of said second surface of said substrate [is] *are* implanted by said second species.

* * * * *